United States Patent
Maeda

[19]

[11] Patent Number: 6,137,350
[45] Date of Patent: Oct. 24, 2000

[54] DIFFERENTIAL AMPLIFIER CIRCUIT

[75] Inventor: Tadashi Maeda, Tokyo, Japan

[73] Assignee: NEC Corporation, Tokyo, Japan

[21] Appl. No.: 09/172,861

[22] Filed: Oct. 15, 1998

[30] Foreign Application Priority Data

Oct. 15, 1997 [JP] Japan .................................. 9-280986

[51] Int. Cl.[7] ...................................................... G06G 7/12
[52] U.S. Cl. .............................. 327/563; 327/56; 327/89
[58] Field of Search ................................ 327/563, 52, 56,
327/72, 77, 88, 89, 336

[56] References Cited

U.S. PATENT DOCUMENTS

| | | | |
|---|---|---|---|
| 4,870,367 | 9/1989 | Nakase et al. ........................... | 328/168 |
| 5,142,554 | 8/1992 | Stribling et al. ......................... | 375/76 |
| 5,438,289 | 8/1995 | Kan et al. ................................. | 327/97 |
| 5,530,395 | 6/1996 | Ting ......................................... | 327/543 |
| 5,994,927 | 11/1999 | Naito et al. .............................. | 327/72 |

FOREIGN PATENT DOCUMENTS 57-50312  3/1982  Japan .
2-177724  7/1990  Japan .
8-195719  7/1996  Japan .

*Primary Examiner*—Timothy P. Callahan
*Assistant Examiner*—Hai L. Nguyen
*Attorney, Agent, or Firm*—Sughrue, Mion, Zinn, Macpeak & Seas, PLLC

[57] ABSTRACT

The average value of an input signal supplied to an input terminal is generated by an integrating circuit consisting of a series circuit of a capacitor, a constant-current source transistor, and a resistor. The average value is used as the reference voltage for the differential amplifier circuit. Further, to each of differential pair transistors the sources of which are commonly connected, other transistors are cascode connected, respectively. Supplied to each gate of the cascode connected transistors is a divisional voltage of the differential voltage between the average voltage from the integrating circuit and the circuit power supply voltage, which divisional voltage is obtained by a capacitive divider circuit.

5 Claims, 12 Drawing Sheets

DIFFERENTIAL AMPLIFIER CIRCUIT

BACKGROUND OF THE INVENTION

1. Field of the Invention

The present invention relates to a differential amplifier circuit, and particularly to a differential amplifier circuit for amplifying the potential difference between an input signal and a reference signal to output a complementary two-phase signal.

2. Description of the Prior Art

Since the GaAs semiconductor has an electron mobility several times faster than Si and allows a semi-insulating substrate to easily be obtained, it is assumed that the parasitic capacity of the circuit can be reduced in the integration process to allow a high-speed logical operation, and thus, based on such assumption, various efforts are moving toward the practical utilization of an optical communication system using such GaAs circuit which has an operation speed of 10 Gbps or higher. Further, the development of 20 to 40 Gbps Ics is proceeded while terabit transmission is taken into consideration.

Specifically, in a high-speed optical communication system of 10 Gbps or higher, the variable-gain amplifier connected to the rear stage of a preamplifier is difficult to speed up as compared with the preamplifier, and thus, as a countermeasure against this, a circuit construction is considered in which the variable-gain amplifier is operated by two-phase driving with the output of the preamplifier being a complementary output. As such circuit, a GaAs source-coupled logic circuit (hereinafter described as SCFL circuit) as shown in FIG. 11, which can easily provide a complementary output, is suitable.

As shown in FIG. 11, the SCFL circuit has a construction in which one end of a resistor 1 used as a load is connected to a power supply terminal 100, the other end of the resistor 1 is connected to an output terminal 41, one end of a resistor 2 is connected to the power supply terminal 100, the other end of the resistor 2 is connected to an output terminal 42, the drain electrode of a field effect transistor (hereinafter described as FET) 11 is connected to the output terminal 41, the gate electrode of the FET 11 is connected to an input terminal 51, the source electrode of the FET 11 is connected to a node 61, the drain electrode of an FET 12 is connected to the output terminal 42, the gate electrode of the FET 12 is connected to an input terminal 52, the source electrode of the FET 12 is connected to the node 61, the drain electrode of an FET 13 is connected to the node 61, the gate electrode of the FET 13 is connected to a control terminal 43, and the source electrode of the FET 13 is connected to a power supply terminal 101.

Now, if one input terminal 51 is applied with a sufficiently high voltage relative to the input terminal 52, a current flows through the FET 11 and the FET 12 cuts off, and thus, the potential at the output terminal 41 drops, while the potential at the output terminal 42 rises.

On the other hand, when a low voltage is applied to the input terminal 51, the FET 11 cuts off and a current flows through the FET 12, and thus the potential at the output terminal 41 rises and the potential at the output terminal 42 drops, resulting in a complementary output.

Generally, the potential at either input terminal is given as a reference potential, and the differential voltage between this potential and the input signal potential is amplified. To form a preamplifier using such circuit, the circuit must be constructed so that it can cover a photodetector current variation in response to the intensity of an optical signal, and the reference potential must be given to it from the outside, or must be internally generated.

Conventionally, as this countermeasure, a technique using current mirror shown in Japanese Patent Application Laid-Open No. 8-195719 has been employed. In this circuit, as shown in FIG. 12, by amplifying the current of a photodetector 204 in a second preamplifier 203 by the use of a current mirror circuit 202, an offset compensation is made so that the average value of the input signal becomes a reference potential.

In the circuit of FIG. 12, the output of the photodetector 204 is input to one input terminal of a differential amplifier circuit 200 through a first preamplifier 201, while the current mirror circuit 202 is connected to the photodetector circuit 204 and the output of the current mirror circuit is input to the other input terminal of the differential amplifier circuit 200 via the second preamplifier 203. This means that a signal based on a current of the same value as the average current flowing through the photodetector is input to the other input terminal of the differential amplifier circuit, by which the offset voltage at the output of the differential amplifier circuit is eliminated to make an offset compensation.

However, this circuit has a problem that the power consumption of the circuit increases, because the second preamplifier is required for the offset compensation. Further, if a reference signal is used, there is a problem that the voltage gain becomes half as compared with the case in which the differential amplifier circuit is driven by a two-phase signal.

It is the object of the present invention to provide a differential amplifier circuit in which a two-phase signal can be obtained from a single-phase signal, the increases in the number of elements and in the power consumption can be suppressed, and a high voltage gain and a wide dynamic range can be provided.

BRIEF SUMMARY OF THE INVENTION

A differential amplifier circuit for amplifying the potential difference between an input signal and a reference signal, the differential amplifier circuit includes an integrating means for averaging the input signal, wherein the output of the integrating means is used as the reference signal.

A differential amplifier circuit as set forth in the first aspect, wherein the integrating means comprises a series connection circuit of a diode and a capacitive element, and the terminal voltage of the capacitive element is used as the reference signal.

A differential amplifier circuit as set forth in the second aspect, wherein the integrating means comprises a series connection circuit of a capacitive element, an active element having a constant-current characteristic, and a resistive element, and the terminal voltage of the capacitive element is used as the reference signal.

A differential amplifier circuit as set forth in the third aspect, wherein the integrating means comprises a series connection circuit of a diode having the function of a capacitive element and an active element having a constant-current characteristic, and a resistive element, and the terminal voltage of the diode is used as the reference signal.

A differential amplifier circuit as set forth in the fourth aspect, wherein the active element is a field effect transistor, the gate and source of which are commonly connected.

A differential amplifier circuit as set forth in the fifth aspect, wherein the integrating means is a series connection circuit of a first diode having the function of a resistive element and a capacitive element.

A differential amplifier circuit as set forth in the sixth aspect, wherein the integrating means comprises a series connection circuit of a first diode having the function of a resistive element, and a second diode having the function of a capacitive element and connected in the direction opposite to the first diode, and the terminal voltage between the second diode is used as the reference signal.

A differential amplifier circuit as set forth in the seventh aspect, the differential amplifier circuit having differential pair transistors, the sources of which are commonly connected, and transistors cascode connected to each of the differential pair transistors, respectively, wherein the output of the integrating means is given to each gate of the cascode connected transistors.

A differential amplifier circuit as set forth in the eighth aspect, wherein the integrating means comprises a series connection circuit of a capacitive element, an active element having a constant-current characteristic, and a resistive element, and the terminal voltage of the capacitive element is used as the reference signal.

A differential amplifier circuit as set forth in the ninth aspect, the differential amplifier circuit having differential pair transistors, the sources of which are commonly connected, transistors cascode connected, to each of the differential pair transistors, respectively, a capacitive divider circuit provided between a power supply voltage and the voltage of the reference signal, wherein the divided voltage of the capacitive divider circuit is given to each gate of the cascode connected transistors.

A differential amplifier circuit as set forth in the tenth aspect, wherein the integrating means comprises a series connection circuit of a capacitive element, an active element having a constant-current characteristic, and a resistive element, and the terminal voltage of the capacitive element is used as the reference signal.

A differential amplifier circuit as set forth in the eleventh aspect, wherein the integrating means comprises a series connection circuit of a diode having the function of a capacitive element, an active element having a constant-current characteristic, and a resistive element, and the terminal voltage of the diode is used as the reference signal.

The operation of the present invention is now described. By providing a construction in which the voltage of a reference signal is input as a signal obtained by averaging an input signal in the integrating circuit, the average value of the input signal is always given as the reference signal even if the potential of the input signal varies. Accordingly, a potential following the dispersion of elements or the current change of the photodetector is obtained. A wide dynamic range can therefore be obtained.

The present invention has a circuit arrangement consisted of the integrating circuit which comprises a series circuit of an element having a capacity, a resistance, and an element having a constant-current characteristic. Thus, even if the potential of the input signal varies, the average value of the signal is always given as the reference signal, so that a potential following the dispersion of elements or the current change of the photodetector is obtained. Accordingly, it is possible to obtain a wide dynamic range.

In addition, in this arrangement, since the element having a constant-current characteristic limits the current flowing through the integrating circuit, without setting a large resistance value to reduce the effect of the load capacity of the integrating circuit, a high-speed operation is achieved. Moreover, there is an advantage that the size of the resistive element generally requiring a large area can be made small.

Further, the integrating circuit has a construction in which the cathode electrode of a diode is connected to one end of the series structure of a resistor and an element having a constant-current characteristic, and the anode electrode of the diode is connected to a power supply terminal. Thus, even if the potential of an input signal varies, the average value of the signal is always given as a reference signal, so that a potential following the dispersion of elements or the current change of the photodetector is obtained. Accordingly, a wide dynamic range can be obtained. Furthermore, this arrangement has an advantage that the capacitive element requiring a large area can be made small by forming the integrating circuit with the capacity of the diode.

Furthermore, in the differential circuit for amplifying the potential difference between the input signal and the reference signal, the pair FETs of the differential circuit are cascode connected, and the gate potential of the high-potential side pair FETs of the cascode connection and the voltage of the reference voltage are given as a signal obtained by averaging the input signal in the integrating circuit. Thus, even if the potential of the input signal varies, the average value of the signal is always given as the reference signal, so that a potential following the dispersion of elements or the current change of the photodetector is obtained. Accordingly, it is possible to obtain a wide dynamic range.

In addition, with this arrangement, a high voltage gain can be achieved, because the equivalent drain conductance of the cascode connected pair FETs can be made small. Further since the gate potential of the cascode connected high-potential side FETs is also obtained from the integrating circuit, a potential following a variation of an input signal can be applied, enabling a stable operation over a wide threshold value range.

Further, in a differential circuit for amplifying the potential difference between an input signal and a reference signal, pair FETs are cascode connected, and the voltage of the reference signal is given as a signal obtained by averaging the input signal in the integrating circuit, the gate potential of the cascode connected high-potential side FETs is given by a potential obtained by dividing the voltage between the power supply and the integrating circuit output by the capacities serially connected between the output terminal of the integrating circuit and the power supply terminal. Thus, even if the potential of the input signal varies, the average value of the signal is always given as the reference signal, so that a potential following the dispertion of elements or the current change of the photodetector is obtained. Accordingly, it is possible to obtain a wide dynamic range.

In addition, with this arrangement, the equivalent drain conductance of the cascode connected pair FETs can be made small, and thus a high voltage gain can be achieved. Further, since the gate potential of the cascode connected high-potential side FETs is given by a potential obtained by capacitively dividing the voltage between the integrating output and the power supply terminal, a potential following a variation can be applied, and thus a stable operation is enabled over a wide threshold range. In addition, by giving a value of capacitive division, the bias can be adjusted so that the driving ability can be made large even in FETs having a positive threshold voltage.

Further, in a differential circuit for amplifying the potential difference between an input signal and a reference signal, the pair FETs of the differential circuit are cascode connected, and the voltage of the reference signal is given as a signal obtained by averaging the input signal in an integrating circuit, and the gate potential of the cascode connected high-potential side pair FETs is given by a potential obtained by dividing the voltage between the power supply and the integrating circuit output by the diodes serially reversely connected between the output terminal of the integrating circuit and the power supply terminal. Thus, even if the potential of the input signal varies, the average value of the signal is always given as the reference signal, so that a potential following the dispertion of elements or the current change of the photodetector is obtained. Accordingly, a wide dynamic range can be obtained.

In addition, with this arrangement, since the equivalent drain conductance of the cascode connected pair FETs can be made small, a high voltage gain can be achieved. Further, since the gate potential of the cascode connected high-potential side FETs is given by a potential obtained by the capacitive dividing of the voltage between the integrating circuit output and the power supply terminal by a diode, a potential following a variation can be applied, and thus a stable operation can be provided over a wide threshold value range.

Moreover, by giving a potential value of capacitive division, the bias can be adjusted so that the driving ability can be made large even in FETs having a positive threshold voltage. In addition, since the capacity is formed by the reverse connection of diodes, there is an additional advantage that the element size can be made small.

Furthermore, a circuit construction is provided in which the integrating circuit is formed by a series connection of a diode and a capacitive element. Thus, even if the potential of the input signal varies, the average value of the signal is always given as the reference signal, so that a potential following the dispertion of elements or the current change of the photodetector is obtained. Accordingly, it is possible to provide a wide dynamic range. In addition, since, in this circuit, the diode having the function of a resistive element is biased to the forward rise voltage or lower, it is possible to obtain an equivalent resistance of several hundreds KΩ or higher. Accordingly, it is also possible that an integration constant corresponding to an input signal of the order of several hundreds KHz is obtained with a small area.

Further, the integrating circuit has a circuit construction in which it consists of a series connection of a diode and a reversely connected diode having the function of a capacitive element. Thus, even if the potential of the input signal varies, the average of the signal is always given as the reference signal, so that a potential following the dispertion of elements or the current change of the photodetector is obtained. Accordingly, a wide dynamic range can be provided. In addition, in this circuit, since the diode having the function of a resistive element is biased to the forward rise voltage or lower, an equivalent resistance of several hundreds KΩ or higher can be obtained, and also, the reversely connected diode having the function of a capacitive element provides a high capacity value even if it has a small area. Accordingly, an integration constant corresponding to an input signal of the order of the several hundreds KHz can be provided with a small area.

DETAILED DESCRIPTION OF THE PREFERRED EMBODIMENTS

Now, the embodiments of the present invention are described according to the drawings.

Figure 1:
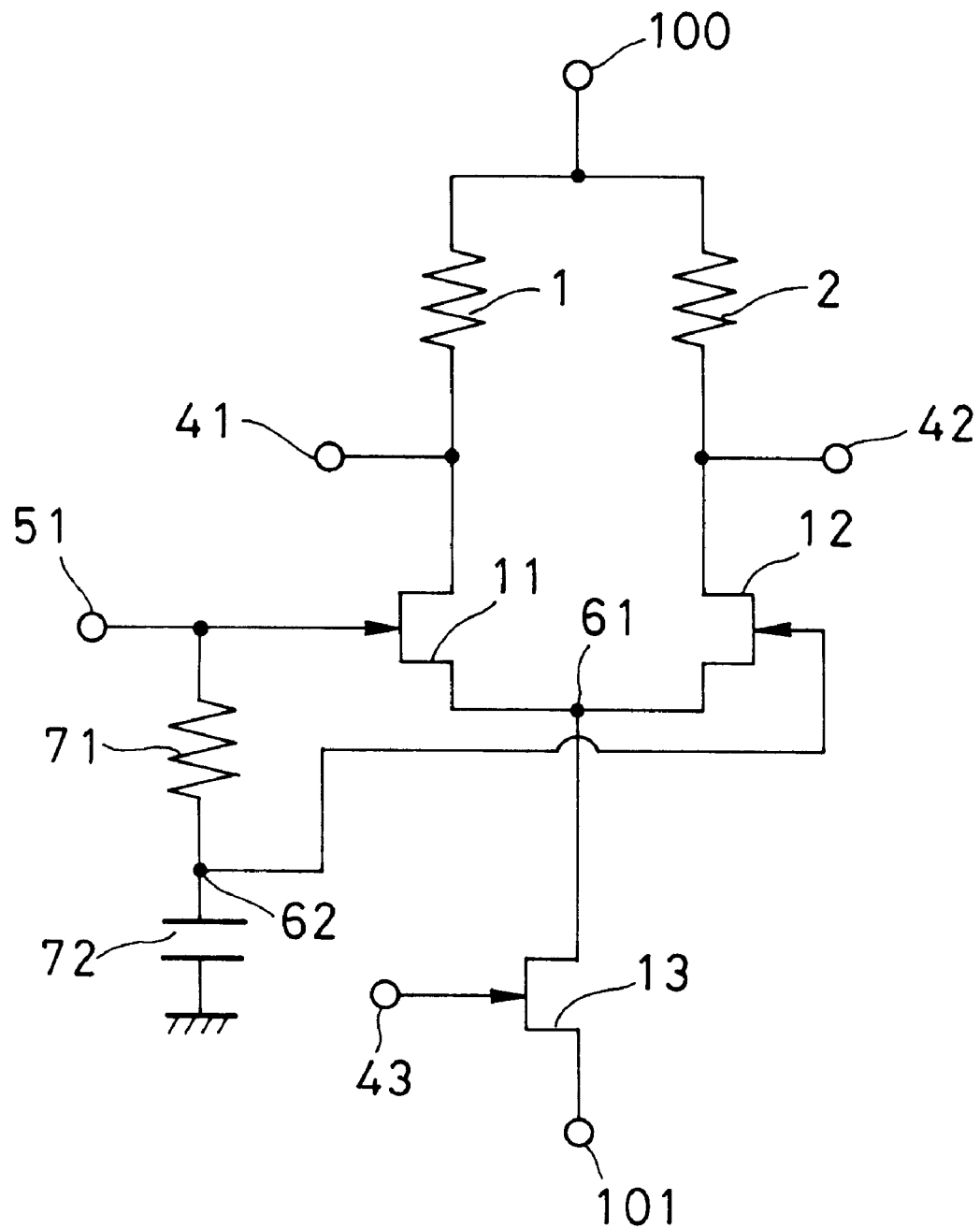
FIG. 1 is a circuit diagram showing an embodiment of the present invention.

FIG. 1 is a diagram showing the first embodiment of the differential circuit according to the present invention. In this embodiment, 51 is an input terminal, 41 and 42 are output terminals, 100 and 101 are power supply terminals, and 43 is a control terminal. Description is made below in a manner in which the same number is assigned to a similar construction.

In the differential circuit of FIG. 1, one end of a resistor 1 used as a load is connected to the power supply terminal 100, and the other end is connected to the output terminal 41. One end of a resistor 2 is connected to the power supply terminal 100, and the other end is connected to the output terminal 42.

The drain electrode of an FET 11 is connected to the output terminal 41, the gate electrode is connected to the input terminal 51, and the source electrode is connected to a node 61. The drain electrode of an FET 12 is connected to the output terminal 42, the gate electrode is connected to a node 62, and the source electrode is connected to the node 61. The drain electrode of an FET 13 is connected to the node 61, the gate electrode is connected to a control terminal 43, and the source electrode is connected to the power supply terminal 101.

One end of a resistor 71 forming an integrating circuit is connected to the input terminal 51, and the other end is connected to the node 62. One end of a capacitive element 72 is connected to the node 62, and the other end is grounded.

If a high voltage is applied to the input terminal 51, a current flows through the FET 11 and the FET 12 cuts off, and thus the potential at the output terminal 41 drops, while the potential at the output terminal 42 rises. On the other hand, if a low voltage is applied to the input terminal 51, the FET 11 cuts off and a current flows through the FET 12, and thus the potential at the output terminal 41 rises, while the potential at the output terminal 42 drops, providing a complementary output. The product of the capacity and the resistance value (hereinafter described as time constant) is designed to be large, so that the potential at the node 62 of the circuit (the integration output of the integrating circuit) becomes the average value of the input signal.

Figure 2:
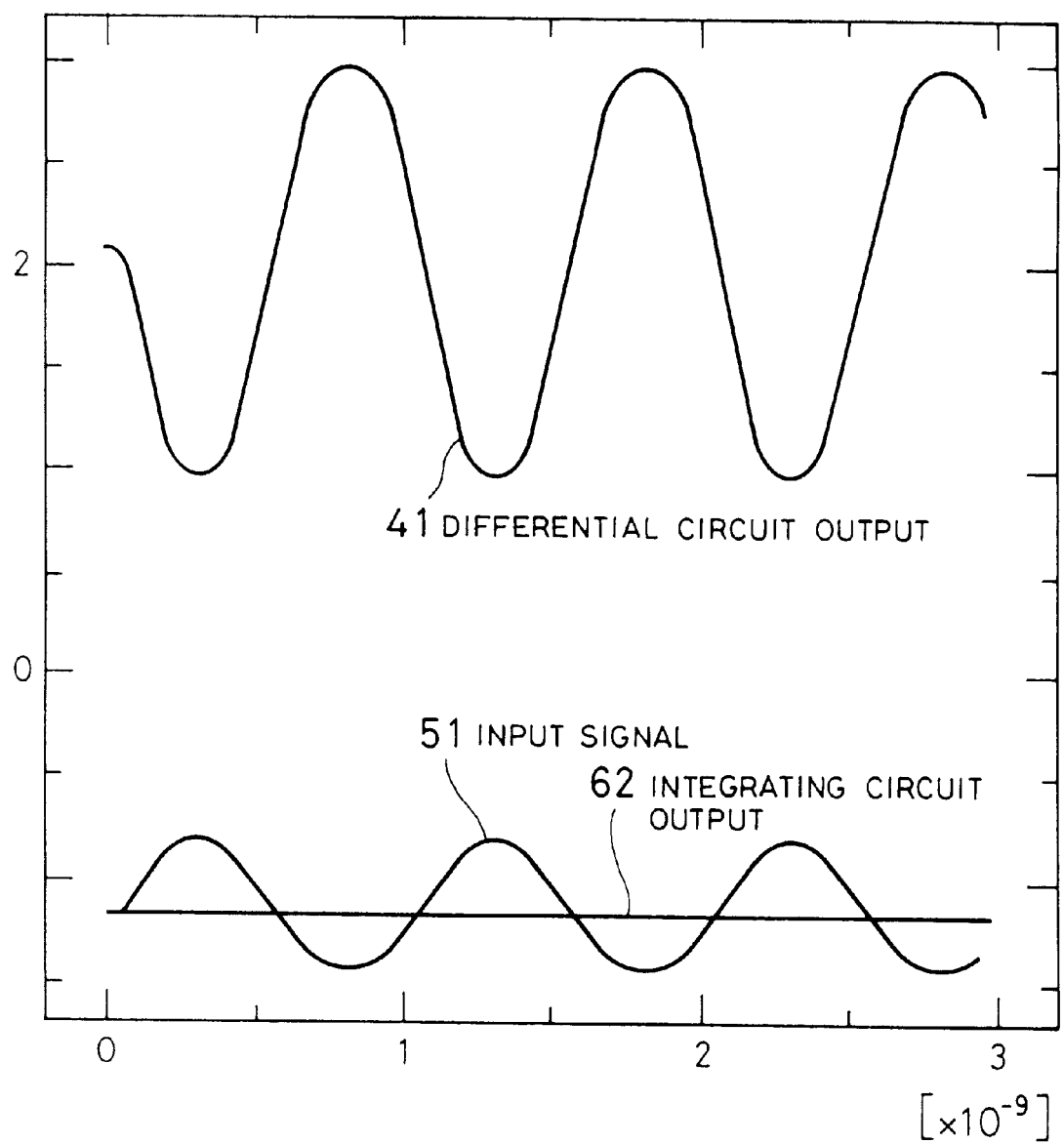
FIG. 2 is a diagram showing a simulation result of the circuit of FIG. 1.

FIG. 2 is a diagram showing a circuit simulation result of the above circuit. In the simulation, the gate length of the FET was 0.25 μm, the gate width was 90 μm for the FETs 11 and 12 and 70 μm for the FET 13, the resistors 1 and 2 were 150 Ω, the resistor 71 is 2 KΩ, and the capacity 72 was 200 pF. Further, the threshold value of the FET was −0.3 V, the maximum transconductance gmmax was 400 mS/mm, and the highest current gain cut-off frequency fT was assumed to be 40 GHz.

In FIG. 2, the frequency of the input signal 51 was assumed to be 1 GHz to make the operation to easily be understood. 62 represents the waveform of the integrating circuit, and it shows that the average value of the input signal is output. 41 represents the output waveform of the differential circuit.

Figure 3:
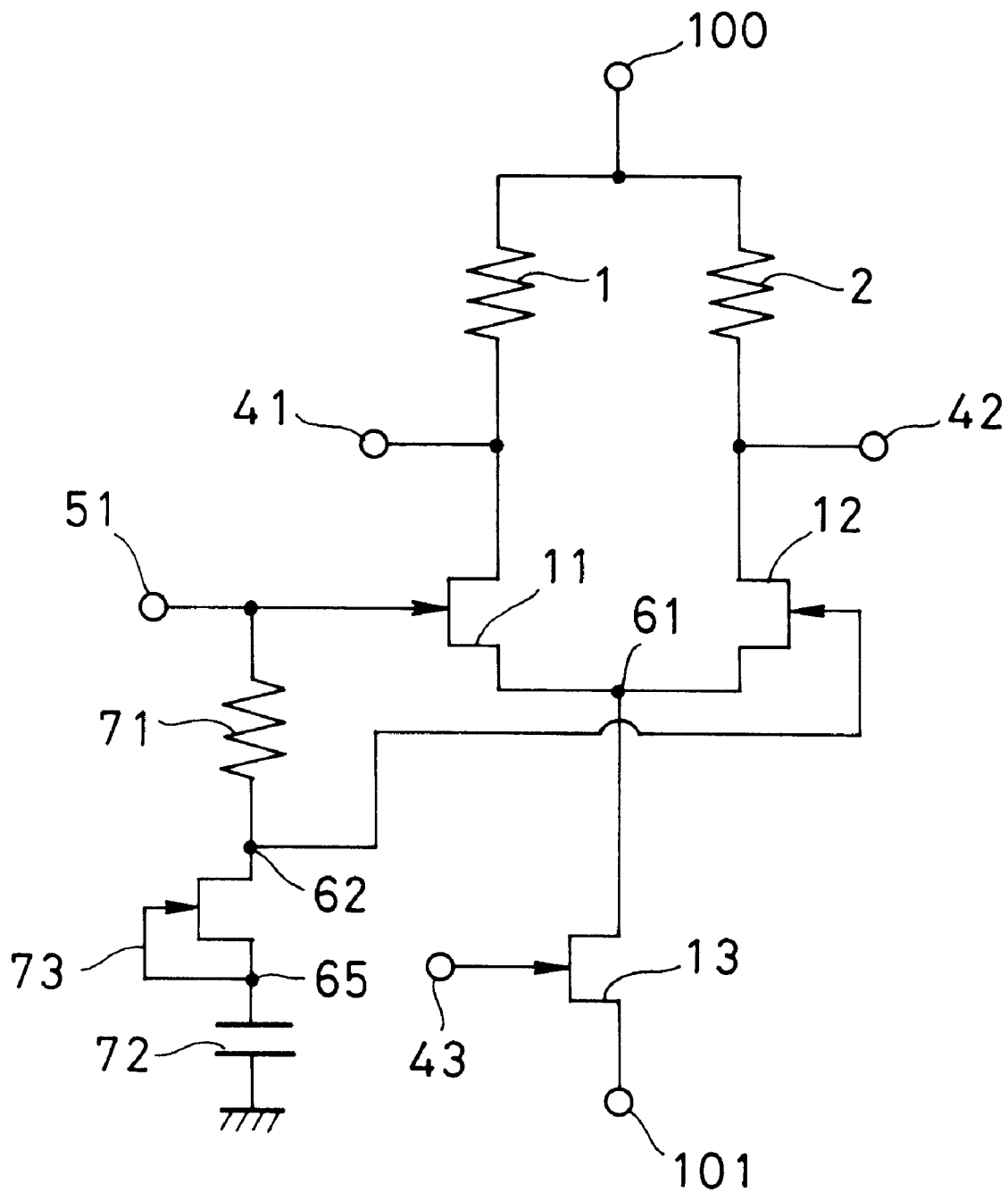
FIG. 3 is a circuit diagram showing a further embodiment of the present invention.

FIG. 3 is a diagram showing the differential circuit according to the second embodiment of the invention. The differential circuit of FIG. 3 is different from FIG. 1 in the construction of the integrating circuit. That is, the integrating circuit is a series connection circuit of a capacitor 72, a resistor 71, and an active element having a constant-current characteristic (FET 73). This circuit also provides a complementary output signal at the output terminals.

Further, also in this circuit, it is necessary to design to provide a large time constant so that the potential at the node 62 is the average value of the input signal, but, by making the gate width of the FET 73 small, the parasitic capacitance can be prevented from having an effect on the input side when the resistance value of the resistor 71 is made small. Accordingly, a wide dynamic range can be obtained, and the IC size can be made small.

In addition, with this arrangement, even if the resistance value is not set to be large to reduce the effect of the capacitive load of the integrating circuit, a high-speed operation can be achieved, because the transistor element 73 having a constant-current characteristic limits the current flowing through the integrating circuit.

Figure 4:
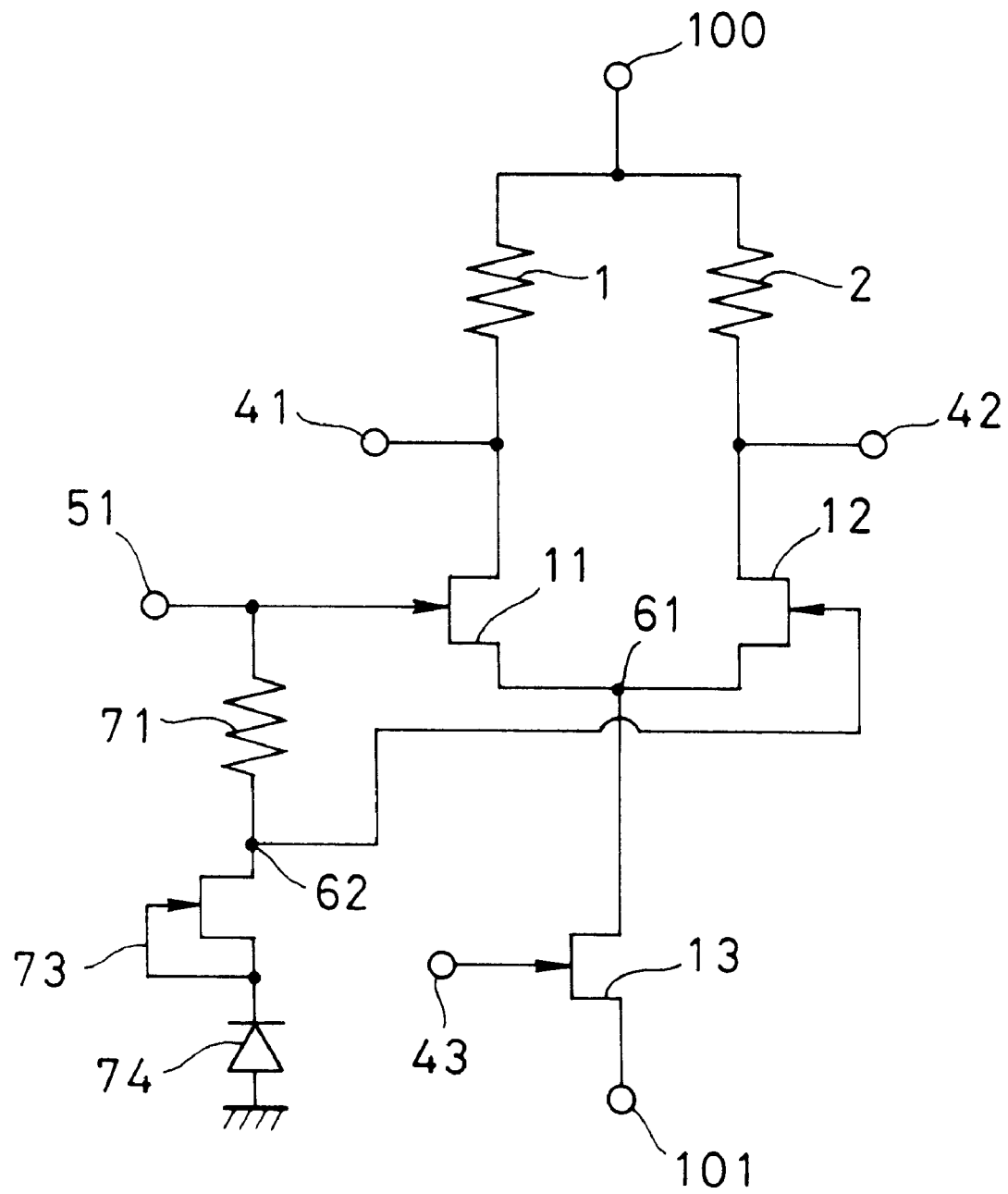
FIG. 4 is a circuit diagram showing still a further embodiment of the present invention.

FIG. 4 is a diagram showing the differential circuit of the third embodiment according to the invention. The differential circuit of FIG. 4 is different from FIG. 1 in the construction of the integrating connection circuit. That is, the integrating circuit is a series circuit of a reverse polarity connected diode 74 having the capacitive function, a resistor 71, and an active element having a constant-current characteristic (FET 73). This circuit also can provide a complementary signal at the output terminals.

Further, in this circuit, the time constant should also be designed to be large so that the potential at the node 62 is the average value of the input signal, but, by making the gate width of the FET 73 small, the parasitic capacitance of the integrating circuit can be preventing from having an effect on the input side even if the resistance value of the resistor 71 is made small. Further, since capacitance is formed by the reverse connection of a diode, the size of the capacitive element requiring a large area can be made small. Accordingly, a wide dynamic range can be obtained, and the IC size can be made small.

Figure 5:
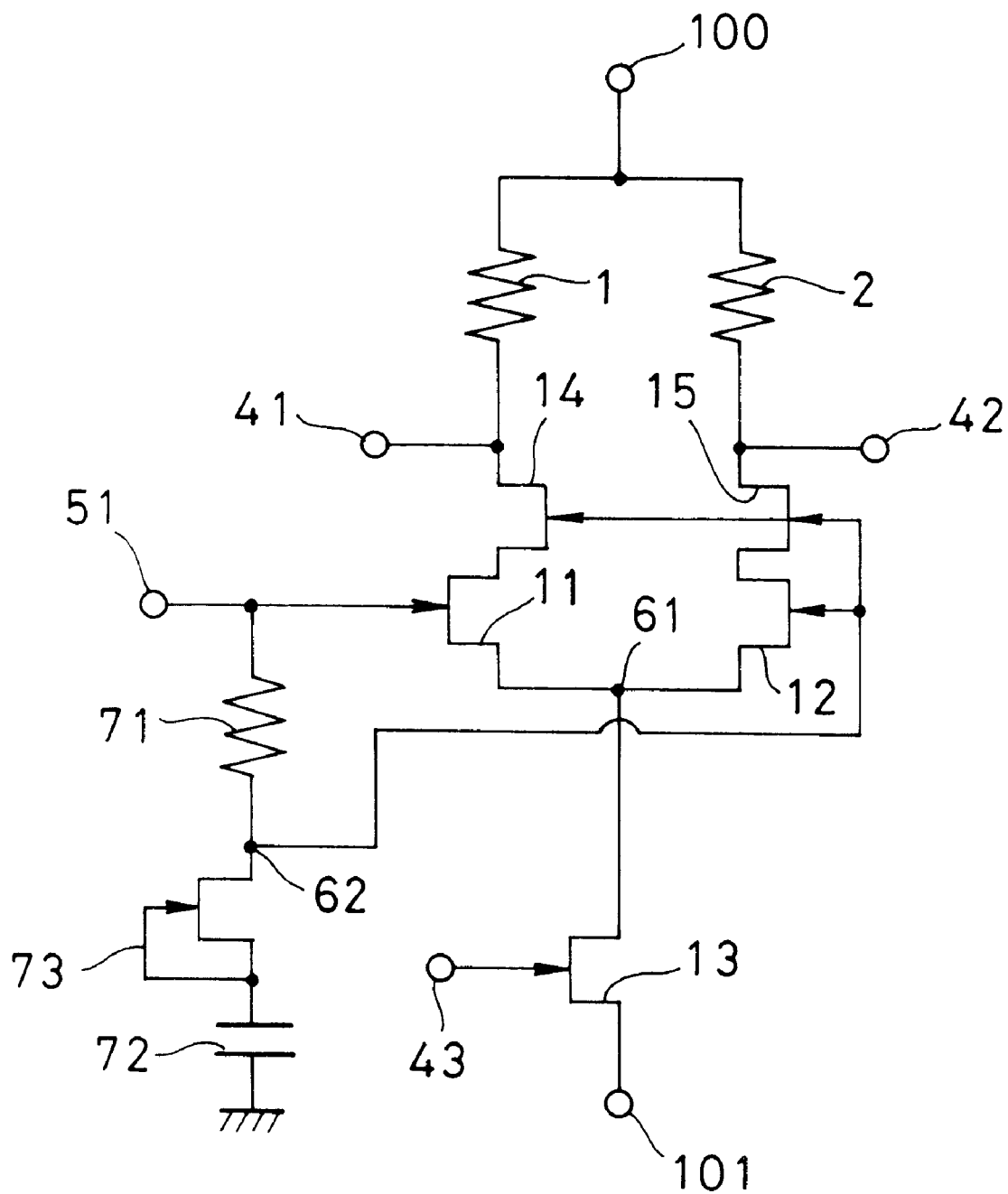
FIG. 5 is a circuit diagram showing another embodiment of the present invention.

FIG. 5 is a diagram showing the differential circuit of the fourth embodiment according to the invention. In the differential circuit of FIG. 5, the differential pair FETs 11 and 12 further have cascode connected FETs 14 and 15. To the gate electrodes of these FETs 14 and 15, the integration output of the integrating circuit (the output at the node 62) is supplied. The remaining construction is the same as that of FIG. 1, and the description of it is omitted. This circuit also provides a complementary output at the output terminal.

In addition, in this circuit, the time constant must also be designed to be large so that the potential at the node 62 is the average value of the input signal, but, by making the gate width of the FET 73 small, the parasitic capacitance of the integrating circuit can be prevented from having an effect on the input side even if the resistance value of the resistor 71 is made small. Further, since the use of the cascode connection in the differential circuit allows the equivalent drain conductance of the pair FETs to be made small, a high voltage gain can be provided.

In addition, since the gate voltage of the high-potential side FETs 14 and 15 which are cascode connected to the differential circuit is obtained from the integrating circuit, a bias according to variation in the element characteristic is also given, and thus a wide dynamic range can be obtained and the IC size can be made small.

Figure 6:
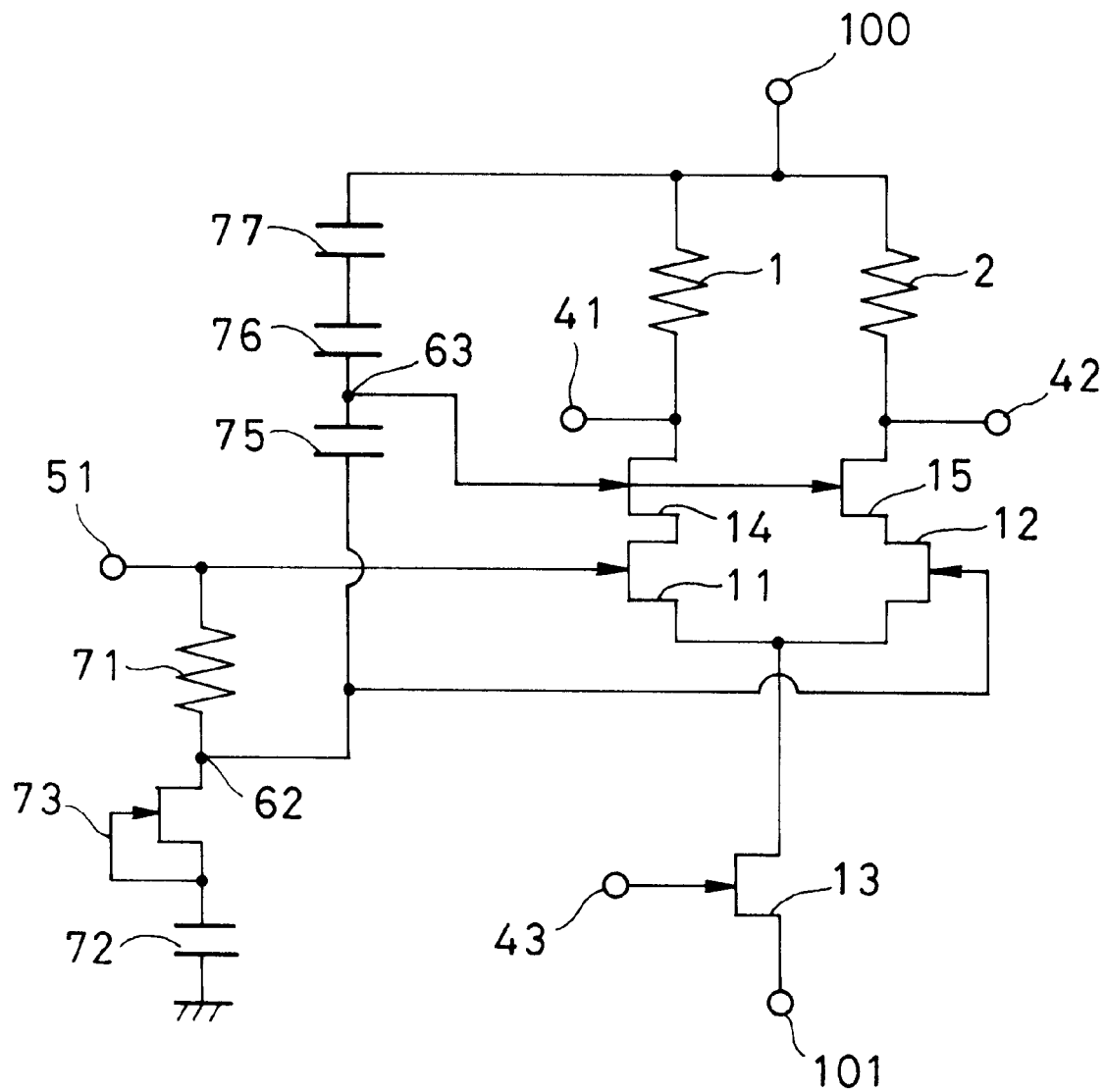
FIG. 6 is a circuit diagram showing still another embodiment of the present invention.

FIG. 6 is a diagram showing the differential circuit of the fifth embodiment according to the invention. In the differential circuit of FIG. 6, the divisional output of the dividing circuit by capacitors 75 to 77 is supplied to the gate electrodes of the cascode connected FETs 14 and 15 in the circuit of FIG. 5. This capacitive divider divides the voltage between the power supply 100 and the node 62, and the divisional voltage at the junction 63 between the capacities 75 and 76 is used as the gate voltage. The remaining construction is the same as that of FIG. 5, and the description of it is omitted. This circuit also can provide a complementary output signal at the output terminals.

In addition, it is also required in this circuit that the time constant should be designed to be large so that the potential at the node 62 is the average value of the input signal, but, by making the gate width of the FET 73 small, the parasitic capacitance of the integrating circuit can be prevented from having an effect on the input side even if the resistance value of the resistor 71 is made small.

Further, since the use of the cascode connection in the differential circuit allows the equivalent drain conductance of the pair FETs to be made small, a high voltage gain can be provided. Furthermore, since the gate voltage of the cascode connected high-potential side FETs 14 and 15 is adapted to capacitively divide the voltage between the integration output and the power supply potential, the potential at the node 63 can be increased by the number of division or the capacitance value to enhance the driving ability of the cascode connected pair FETs. Accordingly, a high-speed circuit can be realized even if enhancement type FETs having a positive FET threshold value are used, and since a bias according to the variation in the element characteristic is also given, a wide dynamic range can be obtained and the IC size can be made small.

Figure 7:
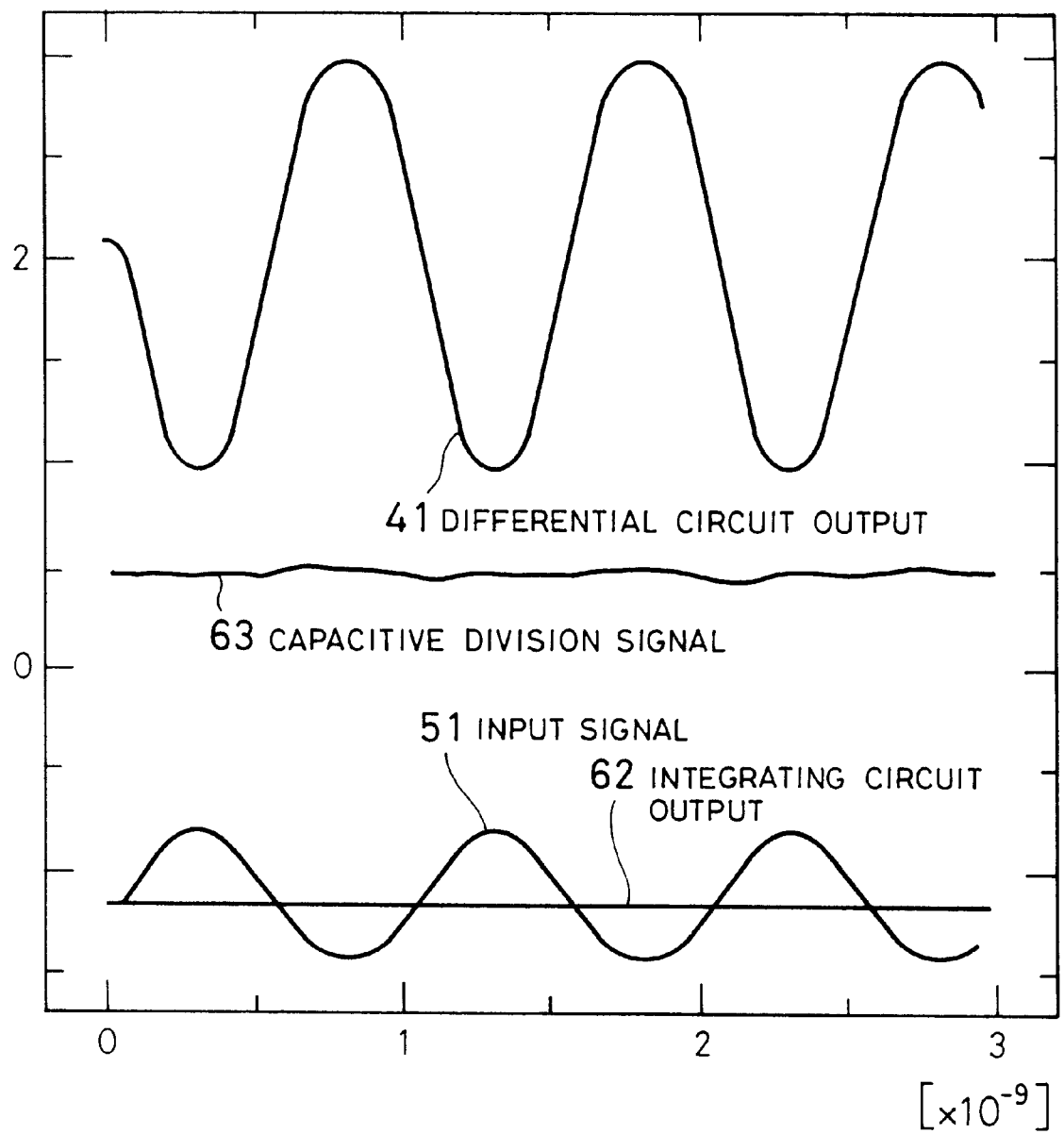
FIG. 7 is a diagram showing a simulation result of the circuit of FIG. 6.

FIG. 7 is a diagram showing a simulation result of the circuit of FIG. 6. In the simulation, the FET gate length was set to 0.25 μm, the gate width was 90 μm for the FETs 11 and 12, 110 μm for the FETs 14 and 15, 70 μm for the FET 13, and 15 μm for the FET 73, and the resistances 1 and 2 were 150 Ω, the resistance 71 was 2 KΩ, the capacitance 72 was 200 pF, and the capacitances 75 to 77 were 15 pF. Further, the FET threshold value was −0.3 V, the maximum transconductance gmmax was 400 mS/mm, and the highest current gain cut-off frequency fT was 40 GHz was assumed to be 40 GHz.

In FIG. 7, the frequency of the input signal 51 was assumed to be 1 GHz for easy understanding of the operation. 62 represents the waveform of the integrating circuit, and it shows that the average value of the input signal is output. 41 represents the output waveform of the differential circuit. In addition, 63 represents the waveform of the capacitive division output.

Figure 8:
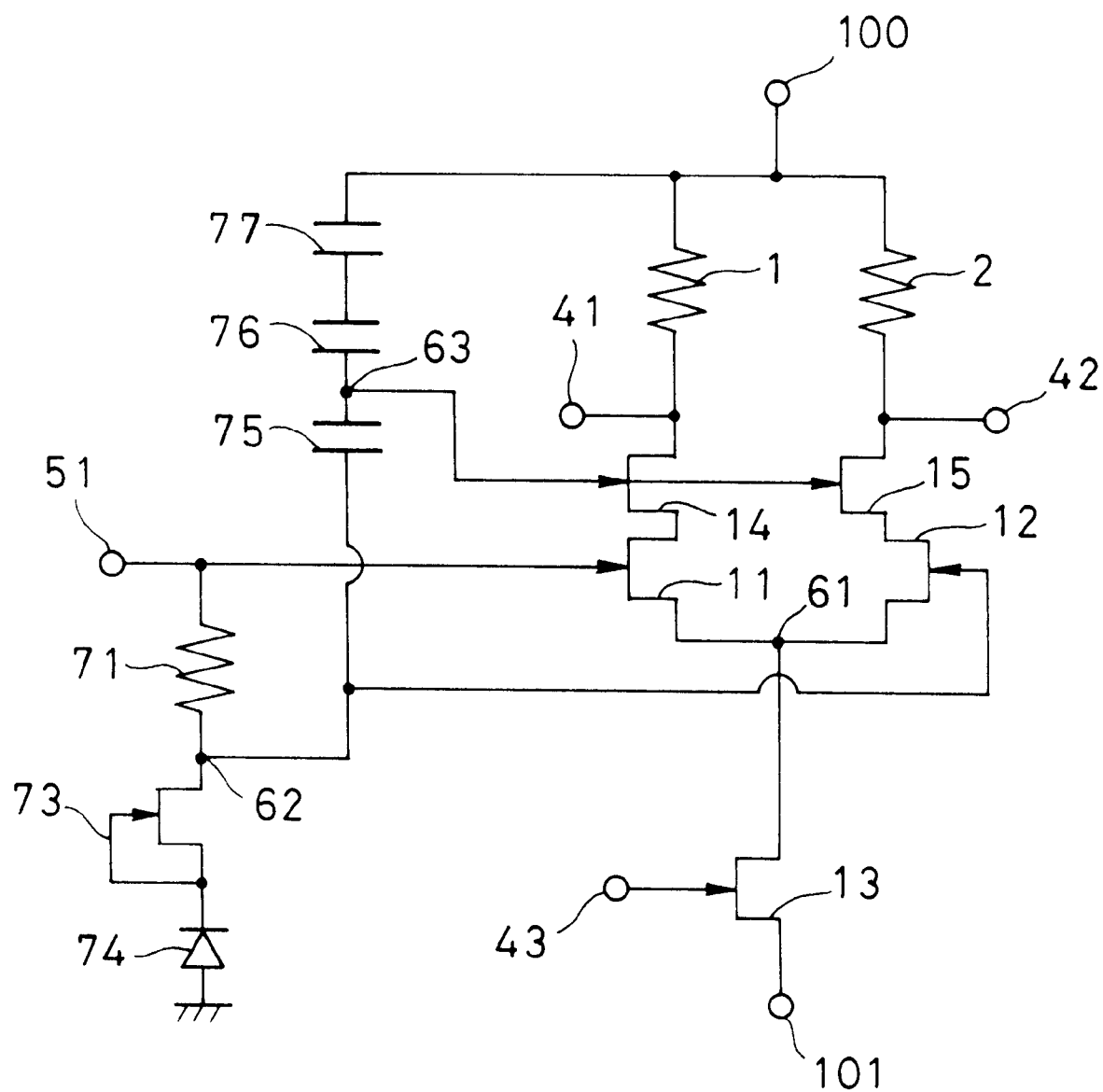
FIG. 8 is a circuit diagram showing a further embodiment of the present invention.

FIG. 8 is a diagram showing the differential circuit of the sixth embodiment according to the invention. In the differential circuit of FIG. 8, the construction of the integrating circuit in the circuit of FIG. 6 is different, and the construction of the integrating circuit in FIG. 4 is employed. That is, the integrating circuit is a series connection circuit of a diode 74, a constant-current element 73, and a resistor 71. The remaining construction is the same as that of FIG. 6, and the description of it is omitted. This circuit can also provide a complementary output signal at the output terminals.

In addition, it is also required in this circuit that the time constant should be designed to be large so that the potential at the node 62 is the average value of the input signal, but, by making the gate width of the FET 73 small, the parasitic capacitance of the integrating circuit can be prevented from having an effect on the input side even if the resistance value of the resistor 71 is made small.

Further, since the use of the cascode connection in the differential circuit allows the equivalent drain conductance of the pair FETs to be made small, a high voltage gain can be provided. In addition, since the gate voltage of the cascode connected high-potential side FETs 14 and 15 capacitively divides the voltage between the integrating output and the power supply potential, the potential at the node 63 can be increased by the number of division or the capacitance value to enhance the driving ability of the cascode connected pair FETs. Accordingly, even if enhancement type FETs having a positive FET threshold value are used, a high-speed circuit can be realized, and a bias according to variation in the element characteristic is also given.

Further, since a capacitor is actualized by the reverse polarity connection of the diode 74, the capacitor requiring a large area is not needed, and the reduction of the chip size is possible. Accordingly, a wide dynamic range can be obtained, and the IC size also becomes small.

Figure 9:
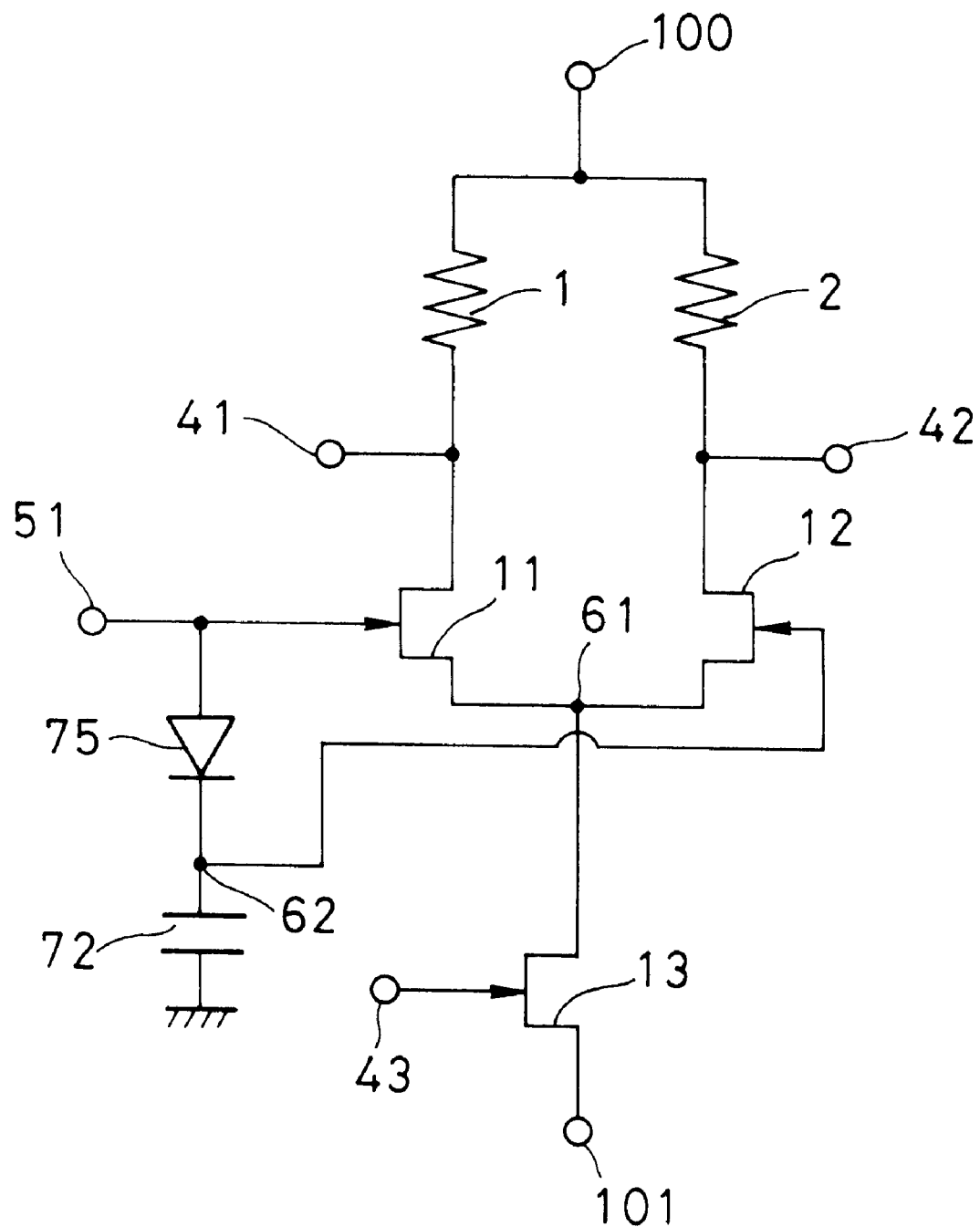
FIG. 9 is a circuit diagram showing a further embodiment of the present invention.

FIG. 9 is a diagram showing the differential circuit of the seventh embodiment according to the invention. In the differential circuit of FIG. 9, the integrating circuit construction is different from FIG. 1. That is, the integrating circuit is a series circuit of a diode 75 and a capacitive element 72. This circuit also provides a complementary output signal at the output terminals.

Further, it is also required in this circuit that the time constant should be designed to be large so that the potential at the node 62 is the average value of the input signal, but, since the diode 75 is biased to the forward rise voltage or lower, an equivalent resistance of several hundreds KΩ or greater can be obtained. Accordingly, an integration constant corresponding to an input signal of the order of several hundreds KHz can also be obtained with a small area.

Figure 10:
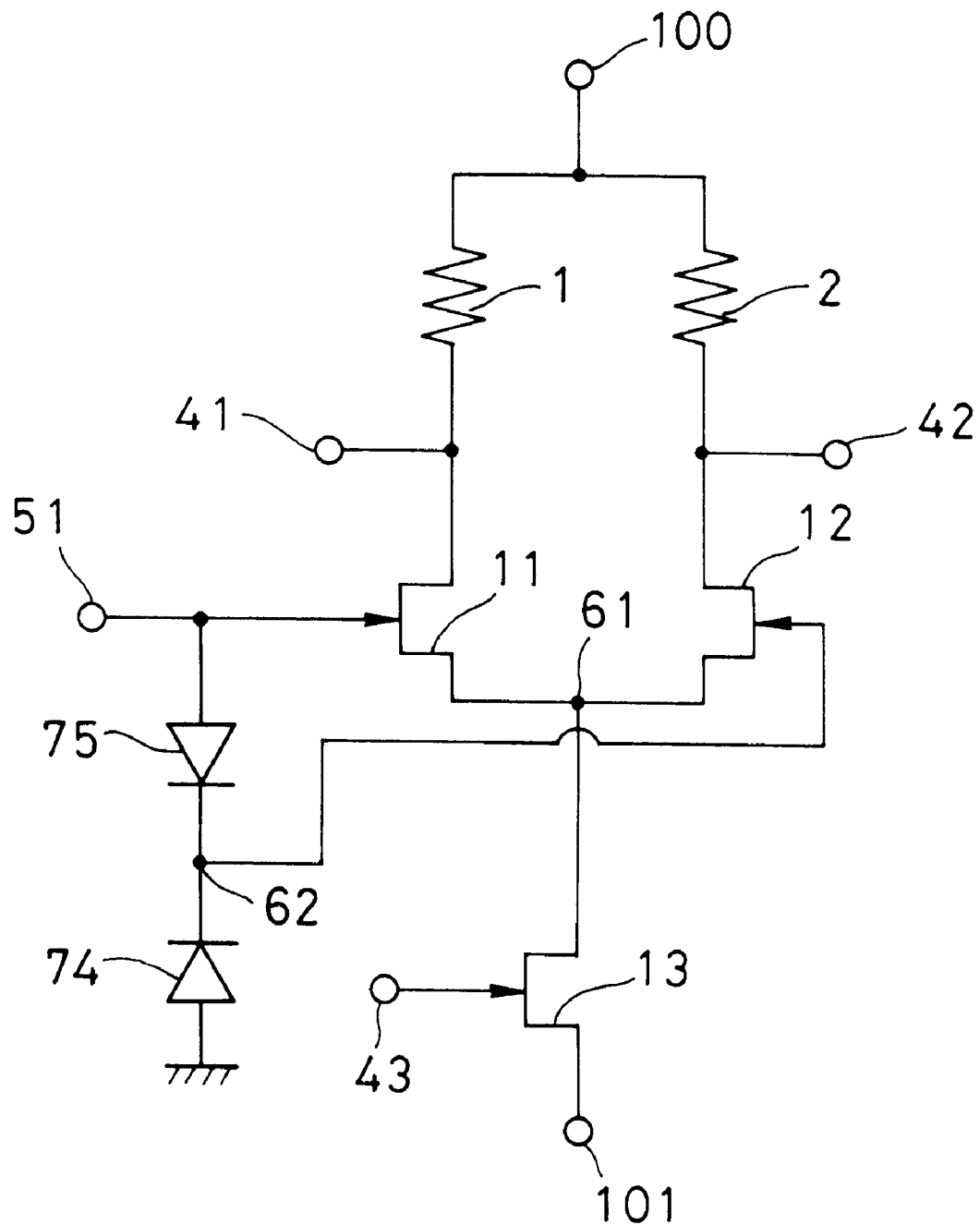
FIG. 10 is a circuit diagram showing a further embodiment of the present invention.
Figure 11:
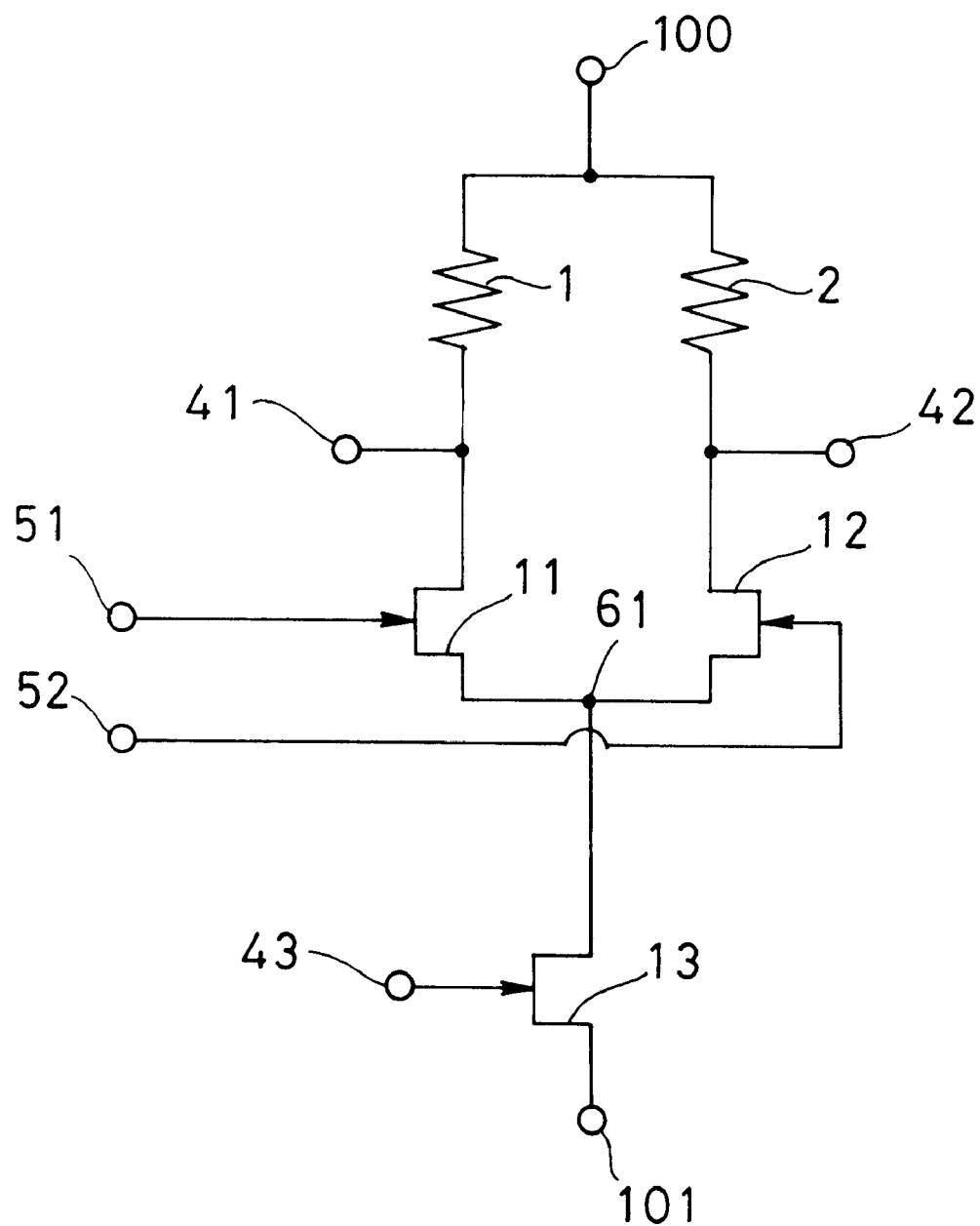
FIG. 11 is a circuit diagram showing an example of the prior art.
Figure 12:
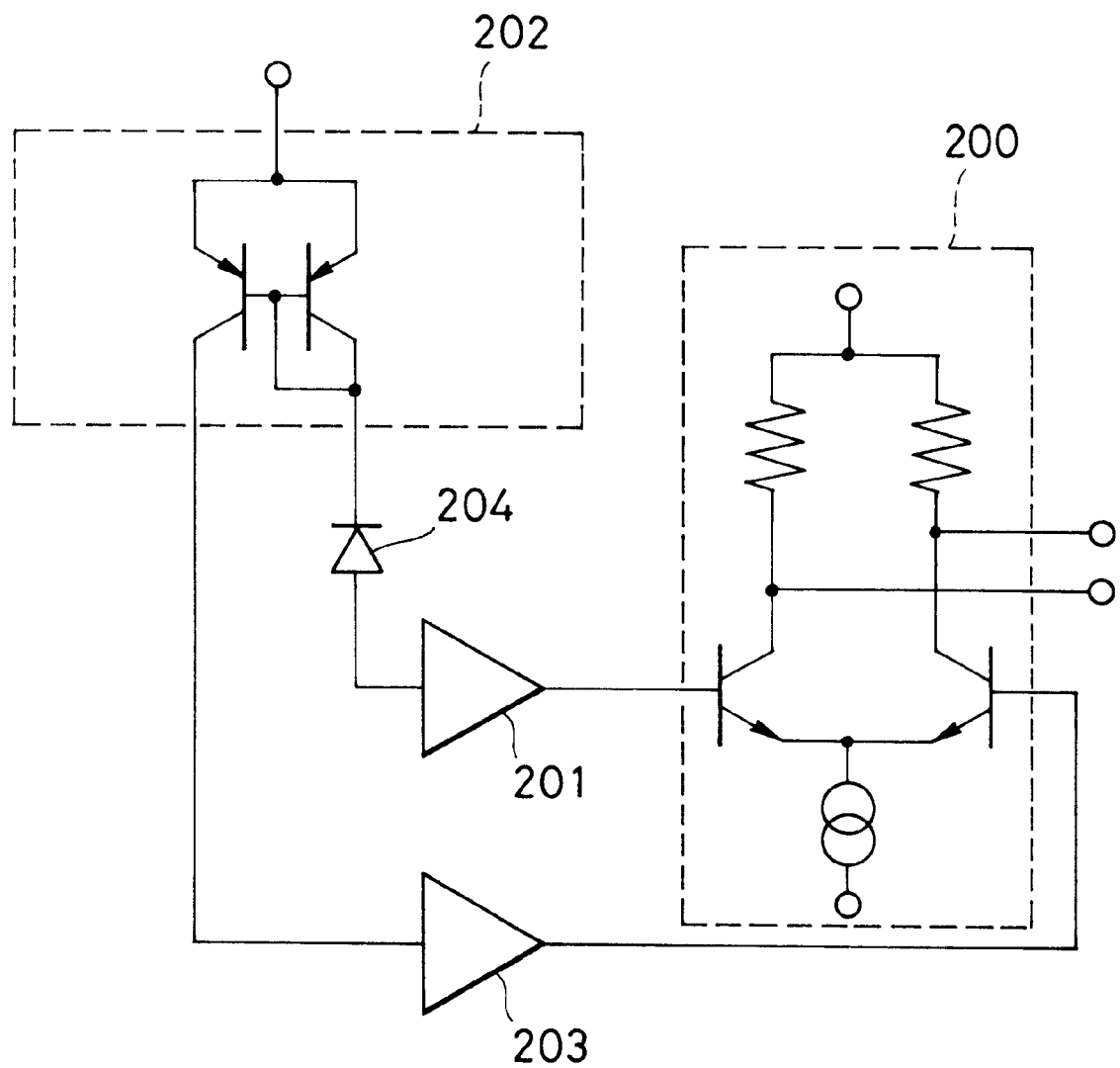
FIG. 12 is a circuit diagram showing another example of the prior art.

FIG. 10 is a diagram showing the differential circuit of the eighth embodiment according to the invention. In the differential circuit of FIG. 10, the integrating circuit construction is different from FIG. 9. That is, the integrating circuit is a series connection circuit of a diode 75 and a diode 74. The diode 75 has the function of a resistor and the diode 74 has the function of a capacitive element, and the diode 74 is connected so as to have a polarity opposite to the diode 75. This circuit also provides a complementary output signal at the output terminals.

Further, it is also required in this circuit that the time constant should be designed to be large so that the potential at the node 62 which is the cathode of the diode 74 is the average value of the input signal, but, since the diode 75 is biased to the forward rise voltage or lower, an equivalent resistance of several hundreds KΩ or greater can be obtained. Accordingly, an integration constant corresponding to an input signal of the order of several hundreds KHz can also be obtained with a small area.

Furthermore, since a capacitor is actualized by the reverse polarity connection of the diode 74, the capacitor requiring a large area is obviated, and the reduction of the chip size is possible. Accordingly, a wide dynamic range can be obtained, and the IC size also becomes small.

In accordance with the present invention, since there is provided a construction in which the voltage of a reference signal is input as a signal obtained by averaging an input signal in an integrating circuit, the average value of the input signal is always given as the reference signal even if the input signal potential varies, and thus a potential following the dispertion of elements or the current change of a photodetector is obtained. Accordingly, a wide dynamic range can be obtained.

Also, in accordance with the present invention, the integrating circuit has a circuit construction in which it comprises a series connection of a capacitor, a resistor, and an element having a constant-current characteristic. Thus, even if the potential of the input signal varies, the average value of the signal is always given as the reference signal, so that a potential following the dispertion of elements or the current change of the photodetector is obtained. Accordingly, a wide dynamic range can be provided. In addition, with this arrangement, even if the resistance value is not set large to reduce the effect of the load capacitance of the integrating circuit, a high-speed operation is possible, because the element having a constant-current characteristic limits the current flowing through the integrating circuit. Moreover, there is an advantage that the size of the resistive element generally requiring a large area can be made small.

Further, in accordance with the present invention, the integrating circuit has a construction in which the cathode electrode of a diode is connected to one end of the series connection of a resistor and an element having a constant-current characteristic, and the anode electrode is connected to a power supply terminal. Thus, even if the potential of an input signal varies, the average of the signal is always given as a reference signal, so that a potential following the dispertion of elements or the current change of the photodetector is obtained. Accordingly, a wide dynamic range can be obtained. In addition, this arrangement has an advantage that the capacitive element requiring a large area can be made small by forming the integrating circuit by the capacitance of the diode.

Furthermore, in accordance with the present invention, in a differential circuit for amplifying the potential difference between an input signal and a reference signal, the pair FETs of the differential circuit are cascode connected, and there is provided a construction in which the gate potential of the cascode connected high-potential side pair FETs and the reference signal voltage are given as a signal obtained averaging the input signal in the integrating circuit. Thus, even if the potential of the input signal varies, the average value of the signal is always given as the reference signal, so that a potential following the dispertion of elements or the current change of the photodetector is obtained. Accordingly, a wide dynamic range can be obtained.

In addition, with this arrangement, since the equivalent drain conductance of the cascode connected pair FETs can be made small, a high voltage gain can be actualized. Further, since the gate potential of the cascode connected high-potential side FETs is also obtained from the integrating circuit, a potential following a variation can be applied, and thus a stable operation can be provided over a wide threshold value range.

Further, in accordance with the present invention, in a differential circuit for amplifying the potential difference between an input signal and a reference signal, the pair FETs of the differential circuit are cascode connected, the voltage of the reference signal is given as a signal obtained by averaging the input signal in an integrating circuit, and the gate potential of the cascode connected high-potential pair FETs is given by a potential obtained by dividing the voltage between the power supply and the integrating circuit output by the capacitances serially connected between the output terminal of the integrating circuit and the power supply terminal.

Thus, even if the potential of the input signal varies, the average value of the signal is given as the reference signal, so that a potential following the dispertion of elements or the current change of the photodetector is obtained. Accordingly, a wide, dynamic range can be provided.

In addition, with this arrangement, since the equivalent drain conductance of the cascode connected pair FETs can be made small, a high voltage gain can be achieved. Further, since the gate potential of the cascode connected high-potential side FETs is given by a potential obtained by capacitively dividing the voltage between the integrating circuit output and the power supply terminal, a stable operation is possible over a wide threshold value range so that the potential corresponding to a variation can be applied. Moreover, by giving a value of a capacitive division, the bias can be adjusted so that the driving ability can be made large even in FETs having a positive threshold voltage.

Furthermore, in accordance with the present invention, in a differential circuit for amplifying the potential difference between an input signal and a reference signal, the pair FETs of the differential circuit are cascode connected, the reference signal voltage is given as a signal obtained by averaging the input signal in an integrating circuit, and the gate potential of the cascode connected high-potential side pair FETs is given by a potential obtained by dividing the voltage between the power supply and the integrating circuit output by the diodes serially reversely connected between the output terminal of the integrating circuit and the power supply terminal.

Thus, even if the potential of the input signal varies, the average value of the signal is always given as the reference voltage, so that a potential following the dispertion of elements or the current change of the photodetector is obtained. Accordingly, a wide dynamic range can be obtained.

In addition, with this arrangement, the equivalent drain conductance of the cascode connected pair FETs can be made small, and thus a high voltage gain can be achieved. Further, since the gate potential of the cascode connected high-potential side FETs is given by a potential obtained by capacitively dividing the voltage between the integrating circuit output and the power supply terminal by means of diodes, a potential following a variation can be applied, and thus a stable operation is provided over a wide threshold value range. In addition, by giving a value of capacitive division, the bias can be adjusted so that the driving ability can be made large even if FETs having a positive threshold voltage. Further, capacitance is formed by the reverse connection of diodes, there is also an advantage that the element size can be made small.

Furthermore, in accordance with the present invention, the integrating circuit has a circuit construction in which it comprises a series connection of a diode and a capacitive element. Thus, even if the potential of the input signal varies, the average value of the signal is always given as the reference signal, so that a potential following the dispertion of elements or the current change of the photodetector is obtained. Accordingly, a wide dynamic range can be obtained. In addition, with this arrangement, since the diode having the function of a resistive element is biased to the forward rise voltage or lower, an equivalent resistance of several hundreds K$\Omega$ or smaller can also be obtained. Accordingly, an integration constant corresponding to an input signal of the order of several hundreds KHz can also be obtained with a small area.

Further, in accordance with the present invention, the integrating circuit has a circuit construction in which it comprises a series connection of a diode and a reversely connected diode having the function of a capacitive element. Thus, even if the potential of the input signal varies, the average value of the signal is always given as the reference signal, so that a potential following the dispertion of elements or the current change of the photodetector is obtained. Accordingly, a wide dynamic range can be obtained. In addition, in this arrangement, since the diode having the function of a resistive element is biased to the forward rise voltage or lower, an equivalent resistance of several hundreds K$\Omega$ or greater can also be obtained. Moreover, the reversely connected diode having the function of a capacitive element provides a high capacitance value even if it is of a small area. Accordingly, an integration constant corresponding to an input signal of the order of several hundreds KHz can also be obtained with a small area.

With the above arrangement, a two-phase signal can be obtained while maintaining the operation speed and power consumption of the current ultra-fast IC, and if the present invention is applied to a future optical communication system, a dramatic increase in performance can be expected.

What is claimed is:

1. A differential amplifier circuit for amplifying the potential difference between an input signal and a reference signal, said differential amplifier circuit comprising:

an integrating means for averaging said input signal, wherein the output of said integrating means is used as said reference signal;

a differential pair of transistors, the sources of which are commonly connected; and a second pair of transistors which are cascode connected to each of said differential pair of transistors, respectively, wherein the output of said integrating means is provided to each gate of the second pair of cascode connected transistors.

2. A differential amplifier circuit as set forth in claim 1, wherein said integrating means comprises a series connection circuit of a capacitive element, an active element having a constant-current characteristic, and a resistive element, and wherein a terminal voltage between said active element and said resistive element is used as said reference signal.

3. A differential amplifier circuit for amplifying the potential difference between an input signal and a reference signal, said differential amplifier circuit comprising:

integrating means for averaging said input signal, wherein the output of said integrating means is used as said reference signal;

differential pair transistors, the sources of which are commonly connected;

a second pair of transistors which are cascode connected to each of said differential pair transistors, respectively; and a capacitive divider circuit provided between a power supply voltage and a voltage of said reference signal, wherein a divisional voltage of said capacitive divider circuit is provided to each gate of said second pair of cascode connected transistors.

4. A differential amplifier circuit as set forth in claim 3, wherein said integrating means comprises a series connection circuit of a capacitive element, an active element having a constant-current characteristic, and a resistive element, and wherein a terminal voltage between said resistive element and said active element is used as said reference signal.

5. A differential amplifier circuit as set forth in claim 3, wherein said integrating means comprises a series connection circuit of a diode having the function of a capacitive element, and an active element having a constant-current characteristic, and a resistive element, and wherein a terminal voltage between said resistive element and said active element is used as said reference voltage signal.

* * * * *